US012696783B2

(12) United States Patent
Song et al.

(10) Patent No.: US 12,696,783 B2
(45) Date of Patent: Jul. 28, 2026

(54) HANDLING A FRAGILE SUBSTRATE FOR INTERCONNECT BONDING

(71) Applicant: ASMPT SINGAPORE PTE. LTD., Singapore (SG)

(72) Inventors: Keng Yew Song, Singapore (SG); Yue Zhang, Singapore (SG); Kim Heng Tan, Singapore (SG)

(73) Assignee: ASMPT SINGAPORE PTE. LTD., Singapore (SG)

( * ) Notice: Subject to any disclaimer, the term of this patent is extended or adjusted under 35 U.S.C. 154(b) by 698 days.

(21) Appl. No.: 18/078,163

(22) Filed: Dec. 9, 2022

(65) Prior Publication Data

US 2024/0194634 A1 Jun. 13, 2024

(51) Int. Cl.
*H10W 72/00* (2026.01)

(52) U.S. Cl.
CPC ...... *H10W 72/0711* (2026.01); *H10W 72/072* (2026.01); *H10W 72/075* (2026.01); *H10W 72/016* (2026.01); *H10W 72/07141* (2026.01); *H10W 72/07173* (2026.01); *H10W 72/07178* (2026.01); *H10W 72/07188* (2026.01); *H10W 72/07521* (2026.01); *H10W 72/07541* (2026.01)

(58) Field of Classification Search
CPC ......... H01L 24/78; H01L 24/75; H01L 24/81; H01L 2224/75251; H01L 2224/75744; H01L 2224/75804; H01L 2224/75981; H01L 2224/78251; H01L 2224/78744; H01L 2224/78802; H01L 2224/78804; H01L 2224/78981; H01L 2224/81097;

H01L 2224/8115; H01L 2224/8116; H01L 2224/85097; H01L 2224/8515; H01L 2224/8516; H01L 2924/3511; H01L 2924/3512; H10W 72/0711; H10W 72/072; H10W 72/07141; H10W 72/07178; H10W 72/07173; H10W 72/07188; H10W 72/016; H10W 72/07541; H10W 72/07521; H10W 72/075
See application file for complete search history.

(56) References Cited

U.S. PATENT DOCUMENTS 10,541,223 B2     1/2020  Kuong et al.
2001/0042777 A1*  11/2001  Kyomasu .............. H01L 24/85
                                                         228/180.5

(Continued)

*Primary Examiner* — George R Koch
(74) *Attorney, Agent, or Firm* — OSTROLENK FABER LLP

(57) ABSTRACT

A bonding apparatus has a bonding platform including a top plate for supporting a fragile semiconductor substrate during interconnect bonding operations conducted on the substrate. Vacuum holes situated on the top plate, forming a first vacuum section, a second vacuum section, and a third vacuum section located between the first and second vacuum sections, generate vacuum suction forces on the substrate during bonding. Individually controllable first, second and third vacuum supplies are connected to the first, second and third vacuum sections respectively. The first and second vacuum supplies cooperate at a first bonding position to generate a vacuum suction force at the first and second vacuum sections, and the second and third vacuum supplies cooperate at a second bonding to position to generate a vacuum suction force at the second and third vacuum sections.

18 Claims, 8 Drawing Sheets

(56) References Cited

U.S. PATENT DOCUMENTS

| 2016/0370712 | A1* | 12/2016 | Shibazaki | ........... | G03F 7/70733 |
| 2019/0164928 | A1* | 5/2019 | Yoshino | ................. | H01L 24/78 |
| 2022/0250167 | A1* | 8/2022 | Nishri | ................. | H01L 21/6838 |

* cited by examiner

SECTION A-A

SECTION B-B

DETAIL C

HANDLING A FRAGILE SUBSTRATE FOR INTERCONNECT BONDING

FIELD OF THE INVENTION

The invention relates to the handling of a substrate, in particular a fragile substrate such as a semiconductor wafer, during processing of the same. Processing of the substrate may include but is not limited to wire or bump ball bonding conducted on the substrate during a semiconductor assembly and packaging process.

BACKGROUND AND PRIOR ART

Conventionally, there is a need to hold a thin substrate (which may be in the form of a semiconductor wafer or ceramic substrate) securely during precision bonding conducted on the substrate, for instance wire bonding or bump ball bonding. Such a substrate may be extremely fragile and can be easily damaged during handling. The thinness of such substrates also make them prone to warpage, so it is necessary to ensure that the substrates are as flat as possible on a bonding platform during bonding.

Moreover, the problem with fragile substrates such as wafers and ceramic substrates when conducting bonding is that warpage may cause uneven heating, leading to cracks and breakage due to thermal shock. Also, while using a conventional approach, the vacuum pressure is generally fixed at maximum value at the outset when the substrate is first introduced in order to secure the substrate immediately. However, generating a high vacuum pressure on the substrate unevenly will risk breakage to the substrate due to the sudden exertion of high localized forces on parts of the substrate.

An illustrative prior art approach is disclosed in U.S. Pat. No. 10,541,223 B2 entitled "Methods of Operating a Wire Bonding Machine to Improve Clamping of a Substrate, and Wire Bonding Machines". A disadvantage of this approach is that, while a fluid system is used to control a warpage of a substrate prior to clamping, since the substrate may still be experiencing some warpage prior to bonding, the reliability of this approach is adversely affected. Moreover, a direct mechanical clamping force exerted on the warped substrate would run a huge risk of breaking the substrate, especially if the substrate is fragile in nature.

It would be beneficial to provide an apparatus and method for handling such fragile substrates which avoids at least some of the shortcomings of the aforesaid prior art.

SUMMARY OF THE INVENTION

It is thus an object of the invention to seek to provide an apparatus and method for handling a fragile substrate which is able to hold the substrate securely on a flat platform while maintaining its planarity and minimizing the risk of damage during the handling thereof.

According to a first aspect of the invention, there is provided a bonding apparatus for holding a fragile semiconductor substrate during interconnect bonding operations conducted on the substrate, the bonding apparatus comprising: a bonding platform having a top plate for supporting the substrate; a plurality of vacuum holes situated on the top plate operative to generate vacuum suction forces on the substrate during bonding, the plurality of vacuum holes forming a first vacuum section, a second vacuum section, and a third vacuum section located between the first and second vacuum sections; and first, second and third vacuum supplies connected to the first, second and third vacuum sections respectively, the first, second and third vacuum supplies being individually controllable; wherein the first and second vacuum supplies cooperate at a first bonding position to generate a vacuum suction force at the first and second vacuum sections when the substrate is being bonded at the first bonding position, and the second and third vacuum supplies cooperate at a second bonding to position to generate a vacuum suction force at the second and third vacuum sections when the substrate is being bonded at the second bonding position during bonding.

According to a second aspect of the invention, there is provided a method for bonding interconnects on a fragile semiconductor substrate, the method comprising the steps of: supporting the substrate on a bonding platform having a top plate, the top plate including a plurality of vacuum holes situated thereon operative to generate vacuum suction forces on the substrate during bonding, wherein the plurality of vacuum holes form a first vacuum section connected to a first vacuum supply, a second vacuum section connected to a second vacuum supply, and a third vacuum section connected to a third vacuum supply, the third vacuum section being located between the first and second vacuum sections, and wherein the first, second and third vacuum supplies are individually controllable; locating the substrate at a first bonding position, the first and second vacuum supplies cooperating to generate a vacuum suction force at the first and second vacuum sections while bonding the substrate at the first bonding position; and locating the substrate at a second bonding position, the second and third vacuum supplies cooperating to generate a vacuum suction force at the second and third vacuum sections while bonding the substrate at the second bonding position.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An exemplary bonding apparatus incorporating the invention will now be described with reference to the accompanying drawings, in which.

DETAILED DESCRIPTION OF THE PREFERRED EMBODIMENT OF THE INVENTION

Figure 1:
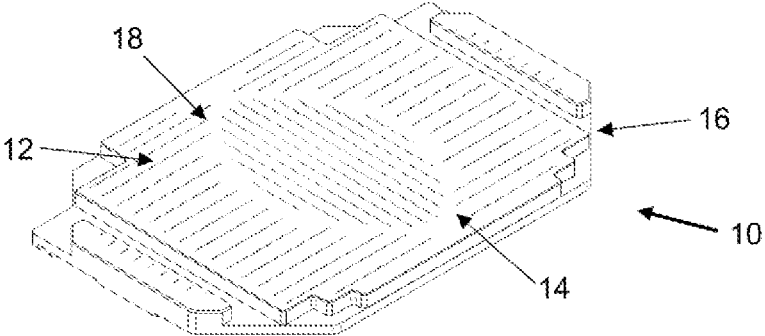
FIG. 1 is a perspective view of a bonding platform for supporting a substrate while conducting bonding on the substrate.

FIG. 1 is a perspective view of a bonding platform 10 of a bonding apparatus for holding and supporting a thin and fragile substrate while conducting interconnect bonding operations on the substrate. The bonding platform 10 has a plurality of vacuum holes 18 situated on a surface of its top plate, and these vacuum holes 18 divide the bonding platform into a left vacuum section 12, a right vacuum section 16, and a middle vacuum section 14 located between the left and right vacuum sections 12, 16.

Vacuum suction forces generated on the substrate are used to hold the substrate in position for forming interconnects by wire bonding or bump ball bonding. The bonding platform has a heater block (not shown) to provide heat to a substrate for creating a wire or bump bonding environment. Each vacuum section 12, 14, 16 has individually controllable vacuum supplies. The number of vacuum sections is not limited and may depend on various factors, such as a size of the substrate.

Figure 2:
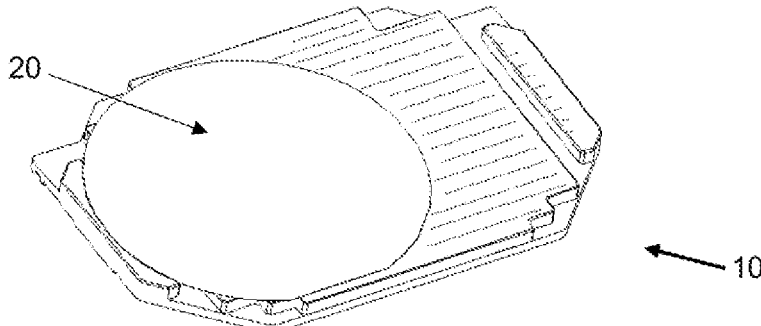
FIG. 2 is a perspective view of the bonding platform on which a substrate has been placed at a first bonding position on the bonding platform.

FIG. 2 is a perspective view of the bonding platform 10 on which a fragile substrate 20 has been placed at a first bonding position on the bonding platform 10. At the first bonding position, the substrate 10 overlies the vacuum holes 18 situated at the left vacuum section 12 as well as the middle vacuum section 14.

At this first bonding position, both the left vacuum section 12 and the middle vacuum section 14 are activated to hold the substrate, while the right vacuum section 16 is not activated. Notably, vacuum pressures in the respective vacuum sections 12, 14, 16 are connected to a vacuum generator having a variable vacuum force comprising two or more phases (see the description relating to FIG. 8). Such an arrangement enables vacuum pressure to be gradually increased in two or more phases to allow the substrate 20 to thermally expand gradually, so as to reduce a risk of warpage, cracking or breakage of the substrate 20 when it is introduced to a new vacuum section 12, 14, 16.

Figure 3:
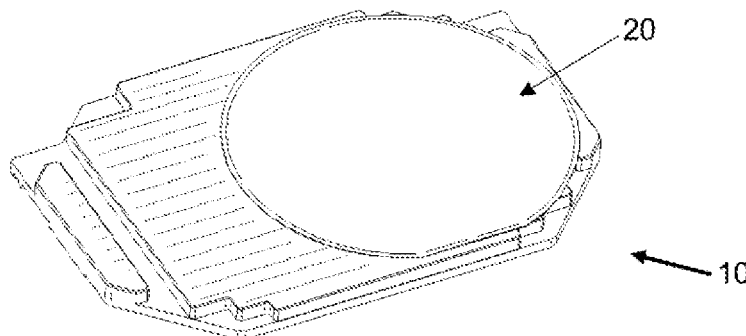
FIG. 3 is a perspective view of the bonding platform on which the substrate has been placed at a second bonding position on the bonding platform.

Additionally, FIG. 3 is a perspective view of the bonding platform 10 on which the substrate 20 has been placed at a second bonding position on the bonding platform 10. In this second bonding position, the substrate 20 overlies the vacuum holes 18 situated at the middle vacuum section 14 as well as the right vacuum section 16.

At this second bonding position, both the middle vacuum section 14 and the right vacuum section 16 are activated to hold the substrate 20 while the left vacuum section 12 is not activated. Again, the vacuum pressure is gradually increased in two or more phases to allow the substrate to thermally expand gradually when the substrate 20 is introduced to the second bonding position.

Therefore, when the substrate 20 is being bonded at the first bonding position, the left and middle vacuum sections 12, 14 cooperate to generate a vacuum suction force to secure the substrate 20, whereas when the substrate 20 is being bonded at the second bonding position, the middle and right vacuum sections 14, 16 cooperate to generate a vacuum suction force to secure the substrate 20

Figures 4A, 4B, 4C:
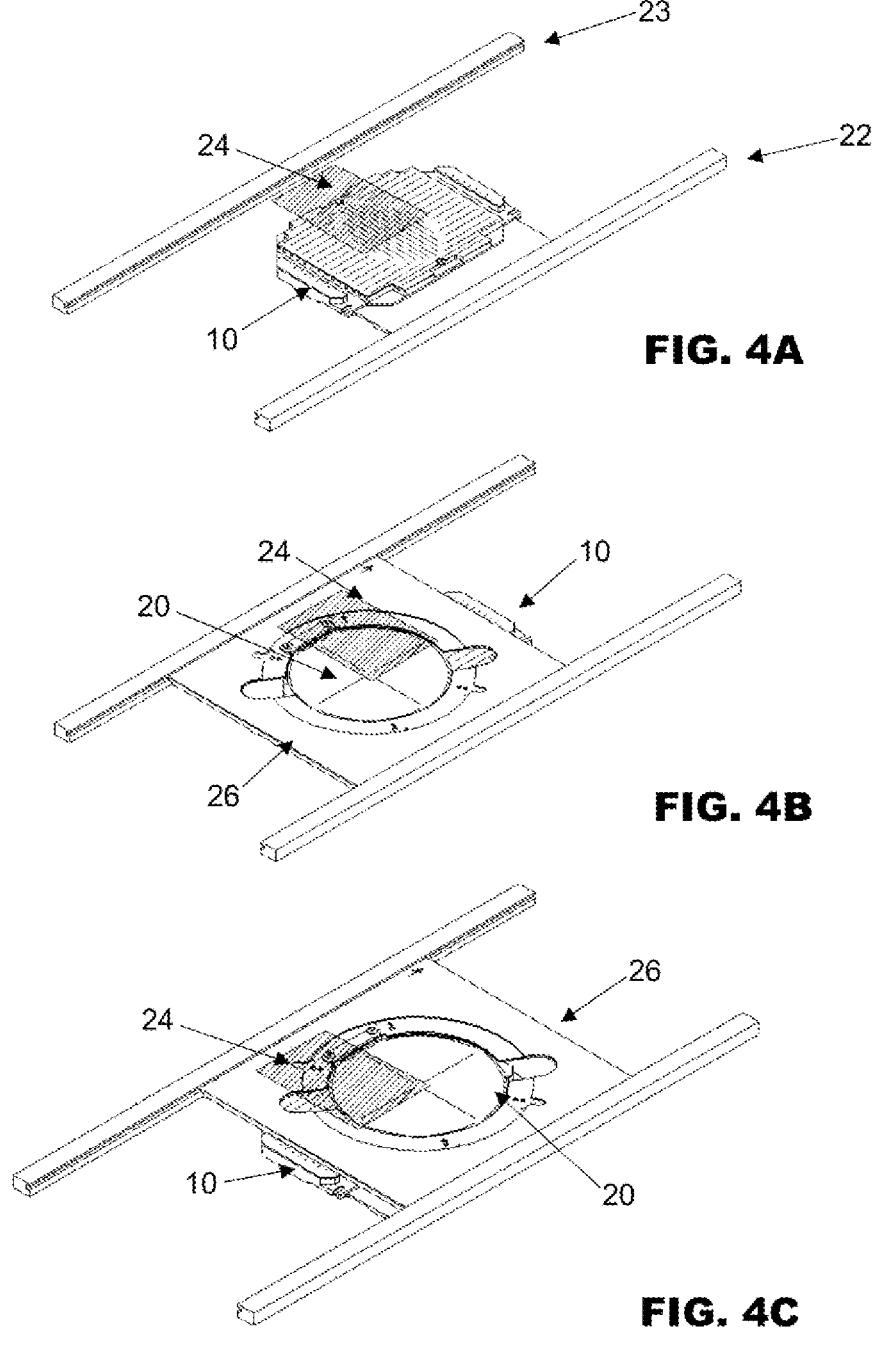
FIG. 4A is a perspective view of the bonding platform including tracks for guiding a substrate carrier.
FIG. 4B is a perspective view of a substrate carrier positioning the substrate at the first bonding position.
FIG. 4C is a perspective view of the substrate carrier positioning the substrate at the second bonding position.

FIG. 4A is a perspective view of the bonding platform 10 including tracks, comprising a front track 22 and rear track 23, for guiding a substrate carrier 26 to move relative to the bonding platform 10. In FIG. 4A, a bonding area 24 is illustrated that is centrally located in relation to the bonding platform 10.

FIG. 4B is a perspective view of the substrate carrier 26 positioning the substrate 20 that is being carried by the substrate carrier 26 at the first bonding position. Before introduction for bonding, the substrate 20 is supported by the substrate carrier 26, and the substrate 20 is conveyed along the front and rear tracks 22, 23 towards the bonding area 24 while being carried by the substrate carrier 26. When the substrate carrier 26 positions the substrate 20 at the first bonding position over the bonding platform 10, the bonding area 24 may be focused on one selected quadrant of the substrate 20 that is towards the right-hand side of FIG. 4B.

FIG. 4C is a perspective view of the substrate carrier 26 positioning the substrate 20 at the second bonding position when it moves further along the front and rear tracks 22, 23 relative to the bonding platform 10. In this position, the bonding area 24 may now be focused on another selected quadrant of the substrate 20 that is towards the left-hand side of FIG. 4C, such that the total coverage of the bonding areas in FIG. 4B and FIG. 4C cover half of a total surface area of the substrate 20 for bonding.

Figure 5A:
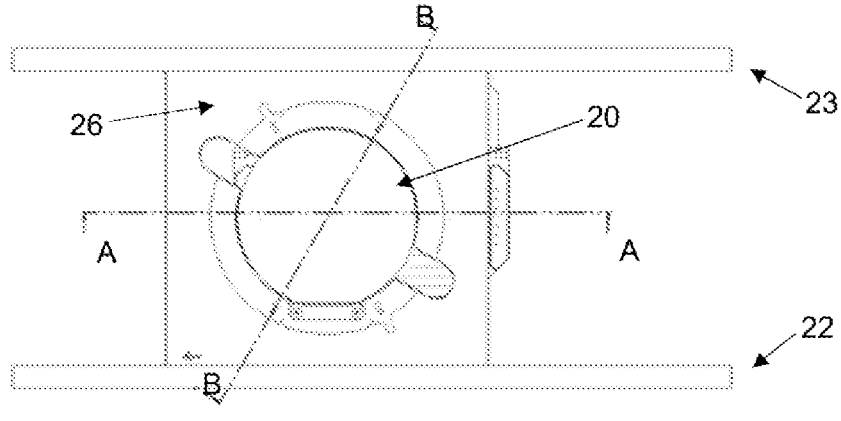
FIG. 5A is a plan view of the substrate carrier guided by the tracks.

FIG. 5A is a plan view of the substrate carrier 26 guided by the front and rear tracks 22, 23. In this view, a rotary indexer 40 is shown that is rotatable together with the substrate 20 carried by the substrate carrier 26, such that the substrate 20 is rotatable relative to the bonding platform 10, and therefore the bonding area 24, by rotary motion of the rotary indexer 40.

Figure 5B:
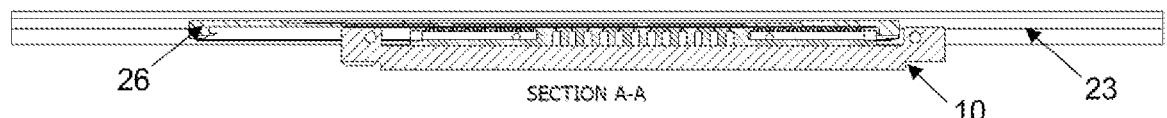
FIG. 5B is a cross-sectional view of the substrate carrier looking along sectional line A-A in FIG. 5A.

FIG. 5B is a cross-sectional view of the substrate carrier looking along sectional line A-A in FIG. 5A. In this view, the bonding platform 10 including its vacuum holes 18 are shown to be below the substrate carrier 26, and the substrate carrier 26 has an opening or through-hole to enable the substrate 20 that it is supporting to be in fluid communication with the plurality of vacuum holes 18. Also, shown is the rear track 23 for conveying the substrate carrier 26 relative to the bonding platform 10. It would be appreciated that the bonding platform is movable up and down relative to the substrate carrier 26, such that the bonding platform 10 is movable towards a raised position in contact with the substrate 20 during bonding for applying a vacuum suction force thereto, and is also movable away to a lowered position spaced from the substrate 20 to allow the substrate carrier 26 to convey the substrate 20 relative to the bonding platform 10.

Figure 5C:
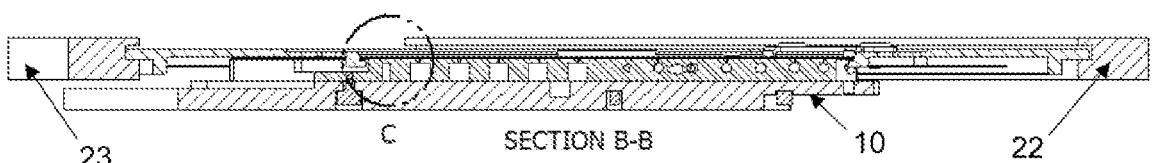
FIG. 5C is a cross-sectional view of the substrate carrier looking along sectional line A-A in FIG. 5A.
Figure 5D:
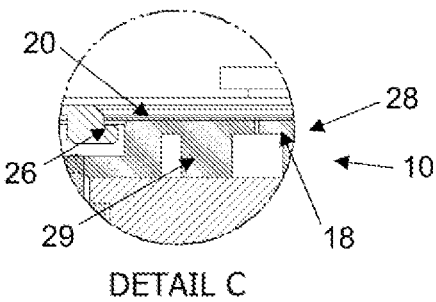
FIG. 5D is a close-up view of detail C shown in FIG. 5C.

FIG. 5C is a cross-sectional view of the substrate carrier 26 looking along sectional line A-A in FIG. 5A. In this view, the front and rear tracks 22, 23 are shown supporting the substrate carrier 26, which edges are located inside a groove formed in the front and rear tracks 22, 23. FIG. 5D is a close-up view of detail C shown in FIG. 5C. In this view, an edge of the substrate 20 is shown to be supported on a recess formed in the substrate carrier 26. Next to the recess is the opening or through-hole in the substrate carrier 26 which enables the substrate to rest on a top plate 28 of the bonding platform 10 when the top plate 28 and bonding platform 10 are in the raised position. Also illustrated are the vacuum holes 18 formed in the top plate 28 which are in direct communication with the substrate 20 at their top and air channels 29 at their bottom. The vacuum holes 18 are operative to apply a vacuum suction force via the air channels 29 onto the substrate 20 in order to secure the substrate 20 when bonding is being performed on the substrate 20.

Although a wire bonding machine usually has a limited bonding area, and the bonding platform 10 has a larger surface to accommodate an entire substrate surface that is larger than the bonding area, the bonding platform 10 has multiple vacuum flow paths to only provide vacuum pressure on portions of the substrate that are directly supported by the top plate 28 while other vacuum holes 18 that are not covered by the substrate 20 are turned off for concentration of the vacuum suction forces. This feature will be explained further below.

Figure 6A:
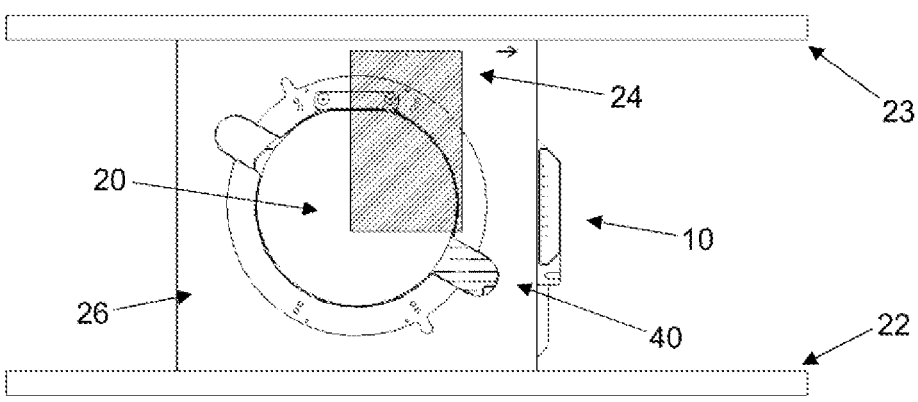
FIGS. 6A to 6D are plan views of different bonding areas that may be implemented with respect to the substrate carrier for conducting bonding on respective portions of an entire substrate that is carried by the substrate carrier.

FIGS. 6A to 6D are plan views of different bonding areas 24 that may be implemented with respect to the substrate carrier 26 for conducting bonding on respective portions of an entire substrate 20 that is carried by the substrate carrier 26. In FIG. 6A, the bonding area 24 is positioned at a first quadrant on a top right-hand side of the substrate 20, where bonding of the substrate 20 may begin. Also illustrated is the rotary indexer 40 which is operable to rotate the substrate 20 relative to the substrate carrier 26 and the bonding area 24.

Figure 6B:
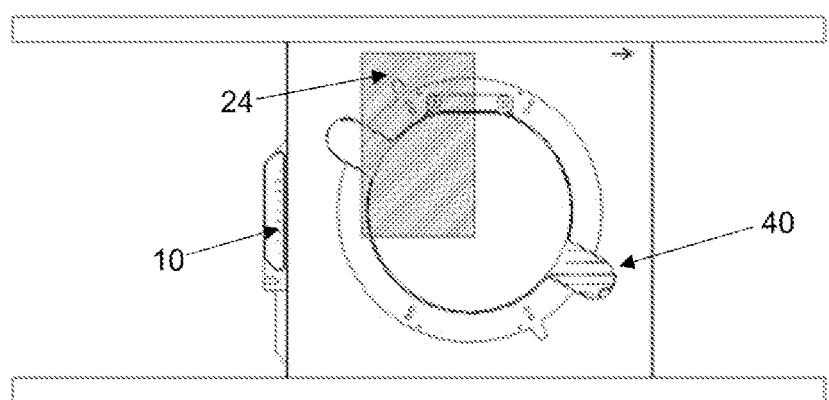
Figure 6C:
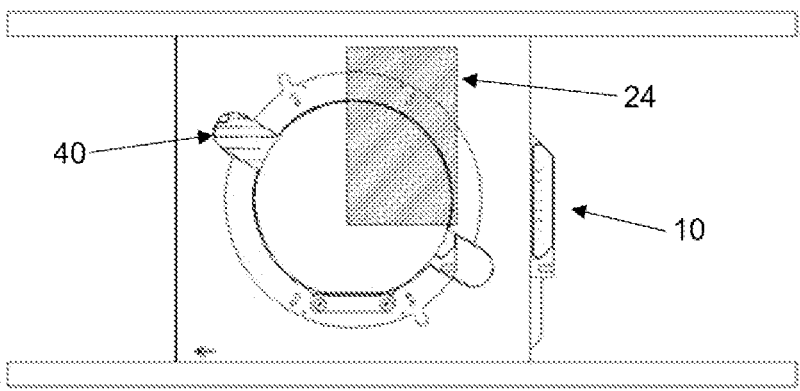

FIG. 6B shows the substrate 20 being moved so that a second quadrant on a top left-hand side of the substrate 20 is now located at the bonding area 24. Bonding may now be performed on the second quadrant of the substrate 20. FIG. 6C shows the rotary indexer 40 being rotated by 180 degrees to rotate the substrate 20 also by 180 degrees so as to locate a third quadrant of the substrate 20 at the bonding area 24.

Figure 6D:
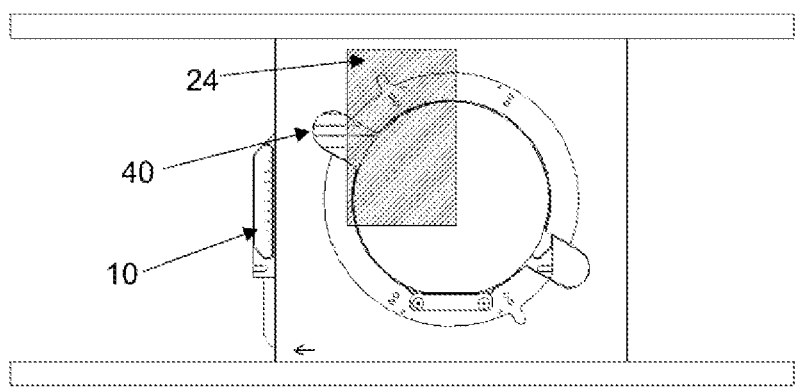

FIG. 6D shows the substrate 20 being moved so that a fourth quadrant on the top right-hand side of the substrate 20 is now located at the bonding area 24, while the rotary indexer 40 (and therefore the substrate 20) remains in its rotated position. Through the above manipulations, the bonding area 24 would be able to access the entire substrate 20 by accessing each quadrant of the substrate 20 separately, even if the bonding area 24 itself is not large enough to cover the entire substrate 20 at once.

Figure 7:
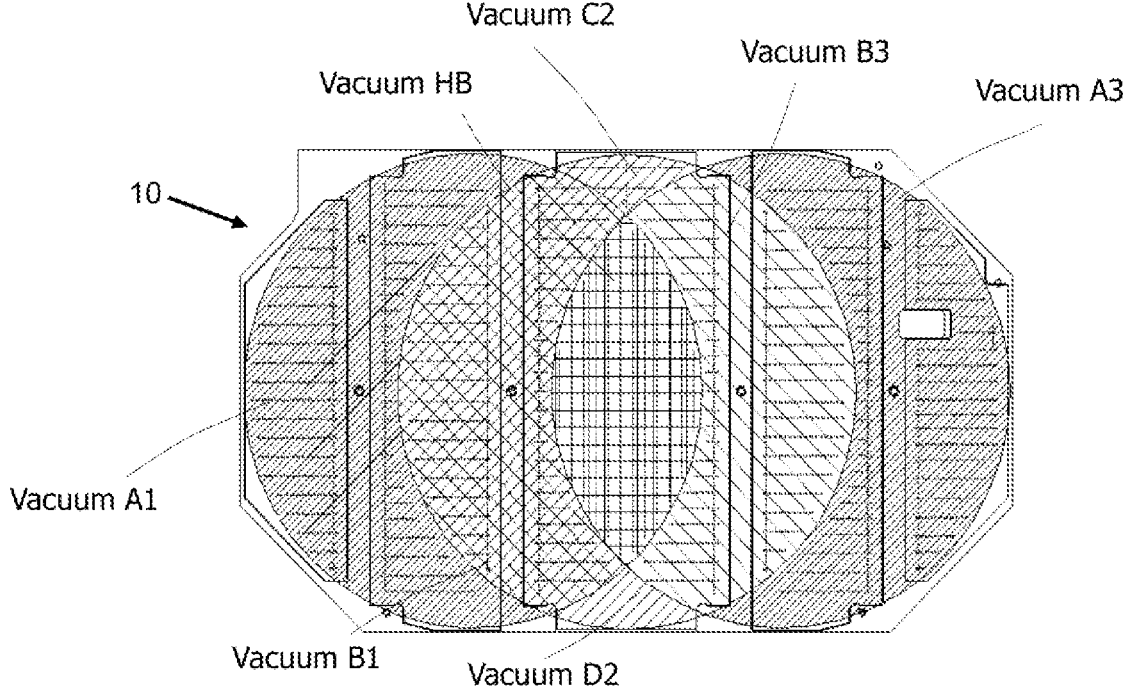
FIG. 7 is a plan view of the bonding platform wherein different vacuum areas of the surface of the of the bonding platform are distinguished.

FIG. 7 is a plan view of the bonding platform 10 wherein different vacuum sections or areas A1, A3, B1, B3, C2, D2, HB on the surface of the bonding platform 10 are distinguished. These vacuum areas are individually smaller than the left, middle and right vacuum sections 12, 14, 16 mentioned previously in the embodiment illustrated in FIG. 1, which corresponded to only the first and second bonding positions. The separate vacuum areas ensure that vacuum suction forces generated at the vacuum holes 18 are controllable such that only areas where a substrate 20 is located on the bonding platform 10 experience a controllable vacuum suction force for securing the substrate 20. Moreover, as will be explained further below, a strong vacuum suction force or a weak vacuum suction force may be independently generated at each of the bonding areas depending on need.

Vacuum areas A1 and A3 are located at extreme left and right portions of the bonding platform 10 respectively. Vacuum areas B1 and B3 are operable to cooperate with vacuum areas A1 and A3 when the substrate 20 is located at the first bonding position and the second bonding position on the bonding platform 10 respectively. Vacuum area C2 at a top section of the bonding platform 10 and vacuum area D2 at a bottom section of the bonding platform 10 are adapted to cooperate with vacuum areas B1 and B3 when the substrate 20 is located centrally on the bonding platform 10. Finally, vacuum area HB is located at a heater block position of the bonding platform 10, the heater block being used to maintain the substrate at an elevated temperature.

Figure 8:
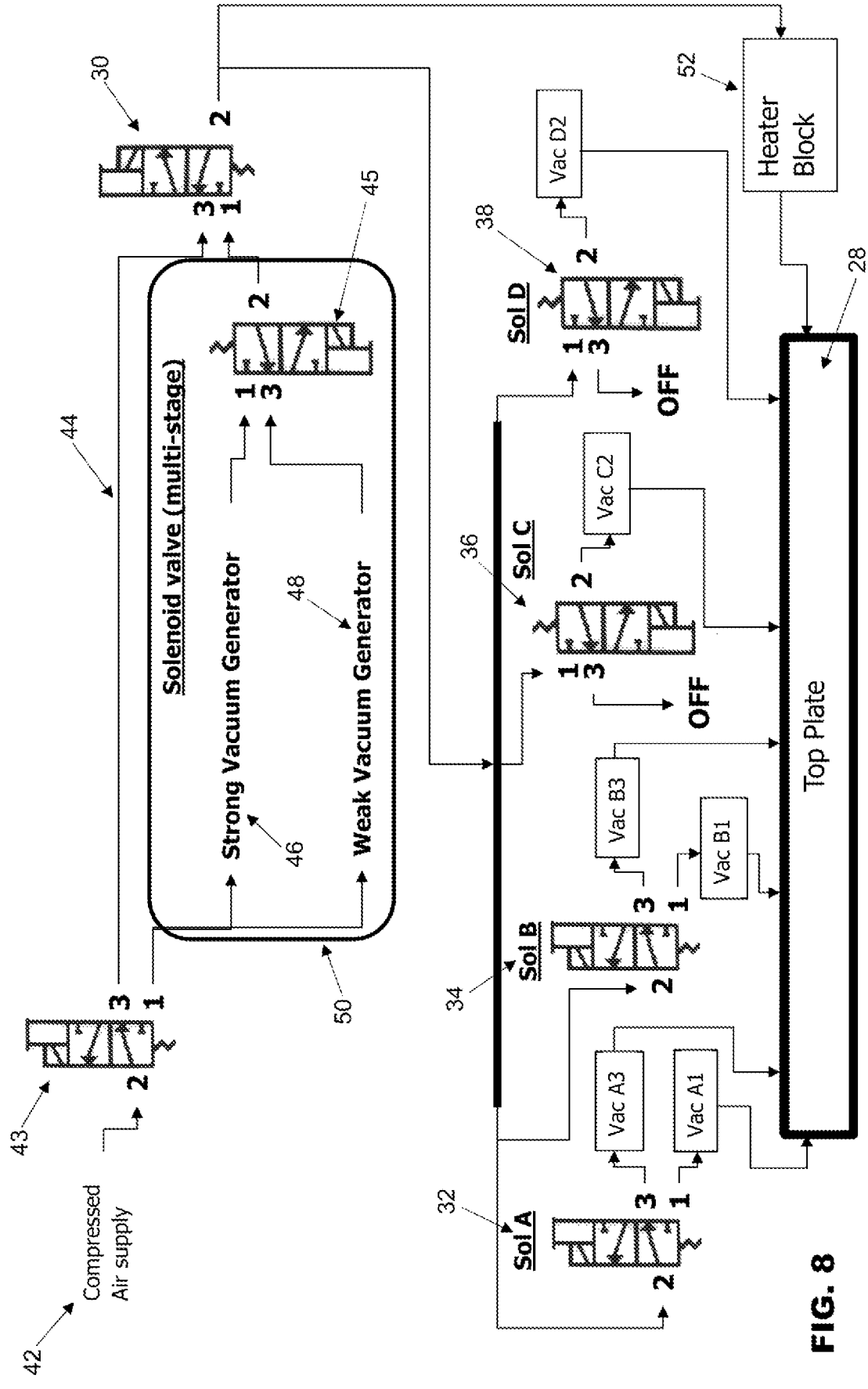
FIG. 8 is a schematic illustration of solenoid valves that may be implemented in relation to the different vacuum areas of the bonding platform according to the preferred embodiment of the invention.

FIG. 8 is a schematic illustration of solenoid valves that may be implemented in relation to the different vacuum areas of the bonding platform 10 according to the embodiment of the invention illustrated in FIG. 7. A compressed air supply 42 is connected to an input/output solenoid valve 43, which is in turn connected to a multi-stage module 50 that can selectively activate a strong vacuum generator 46 or a weak vacuum generator 48 for producing either strong or weak vacuum. A fast release channel 44 is in fluid communication with the compressed air supply 42 to provide air pressure to assist the removal of the substrate 20 from the top plate 28 when bonding on the substrate 20 is completed. An air channel passing through the heater block 52 is in fluid communication with a vacuum manifold in the top plate 28 at vacuum area HB.

In one embodiment of the invention, variable vacuum forces comprising different phases of weak or strong vacuum suction may be activated at the individual vacuum areas by switching a pressure control solenoid valve 45. When the pressure control solenoid valve 45 is operatively connected to the strong vacuum generator 46, a strong vacuum force will be output to a main solenoid valve 30 to generate a strong vacuum suction force at the vacuum areas. On the other hand, when the pressure control solenoid valve 45 is operatively connected to the weak vacuum generator 48, only a weak vacuum force will be output to the main solenoid valve 30 to generate a weak vacuum suction force at the vacuum areas. Apart from distinct strong and weak vacuum generators 46, 48, it is also possible to incorporate a variable pressure regulator instead, which would allow the multi-stage module 50 to gradually increase or decrease the vacuum suction force between the two or more phases. Thus, different methods of providing variable vacuum pressure can be used such as introducing an electronic pressure regulator for controlling the said vacuum pressure steplessly in proportion to a variable electrical signal.

Accordingly, when the substrate 20 is first introduced to a bonding position, weak vacuum suction is generated but is then gradually increased in two or more phases to allow the substrate 20 to thermally expand gradually, so that the risk of warpage, cracking or breakage of the substrate 20 can be avoided.

Using such a multi-stage module 50 to control the vacuum pressure in two or more phases gradually to secure the substrate 20 in place avoids cracking or breakage by promoting gradual flattening of the substrate. The multi-stage module 50 may thus consist of one or more vacuum generators, solenoid valves to control the air flow paths, and/or pressure regulators with pressure control. As mentioned, the bonding platform 10 has several in-built flow paths with small vacuum holes 18 on the top plate 28 for generating vacuum suction at selected areas according to a position of the substrate 20 on the top plate 28.

With this design, vacuum suction forces at different areas of the bonding platform 10 are connected to different vacuum supplies and can be individually controlled, such as by solenoid valves. In particular, the main solenoid valve 30 is a vacuum supply that centrally controls the vacuum force generated at all the vacuum areas (e.g. A1, A3, B1, B3, C2 and D2). A vacuum supply controlled by solenoid valve A 32 is connected to two vacuum areas A1 and A3, such that solenoid valve A 32 is operable to activate or deactivate vacuum generation at vacuum areas A1 and A3. Specifically, by using a solenoid valve with a 3/2-way valve structure as indicated in FIG. 8, the solenoid valve A 32 may selectively route a vacuum suction path via either vacuum area A1 or A3 by switching the solenoid valve. Another vacuum supply controlled by solenoid valve B 34 is similarly connected to two vacuum areas B1 and B3, such that solenoid valve B 34 is operable to selectively activate or deactivate vacuum generation at vacuum areas B1 and B3.

Moreover, further vacuum supplies are provided in the form of a solenoid valve C 36 connected to vacuum area C2 and a solenoid valve D 38 connected to vacuum area D2. Solenoid valve C 36 and solenoid valve D 38 are operable to activate or deactivate vacuum generation at vacuum areas C2 and D2 respectively. Hence, the vacuum generation at each of the vacuum areas may be independently controlled by solenoid valves A, B, C and D 32, 34, 36, 38, whereas vacuum generation by the bonding platform 10 as a whole may be centrally controlled by the main solenoid valve 30.

Figure 9:
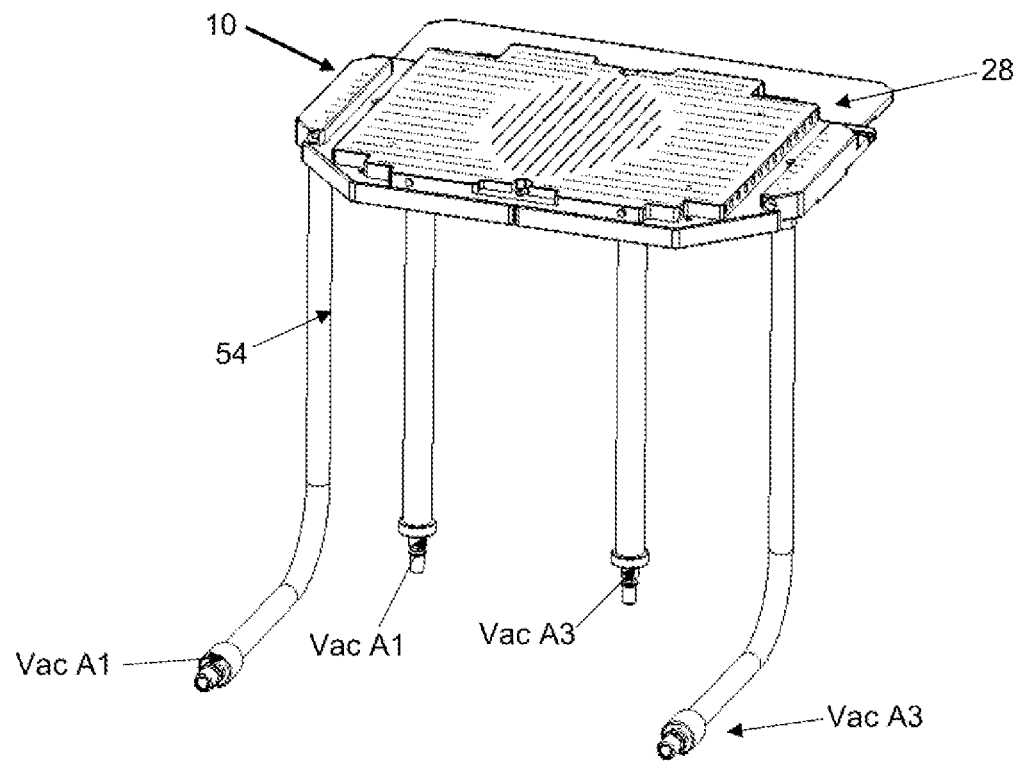
FIG. 9 is a perspective view of the bonding platform including vacuum pipes connected to the bonding platform.

FIG. 9 is a perspective view of the bonding platform 10 including vacuum pipes 54 connected to the bonding platform 10. For the sake of brevity, only the vacuum pipes 54 connecting the vacuum holes 18 at vacuum areas A1 and A3 of the top plate 28 to a vacuum input are illustrated. The vacuum pipes 54 are in fluid communication with the air channels 29 inside the bonding platform 10 leading to vacuum holes 18 located in the respective vacuum areas A1, A3.

Figure 10:
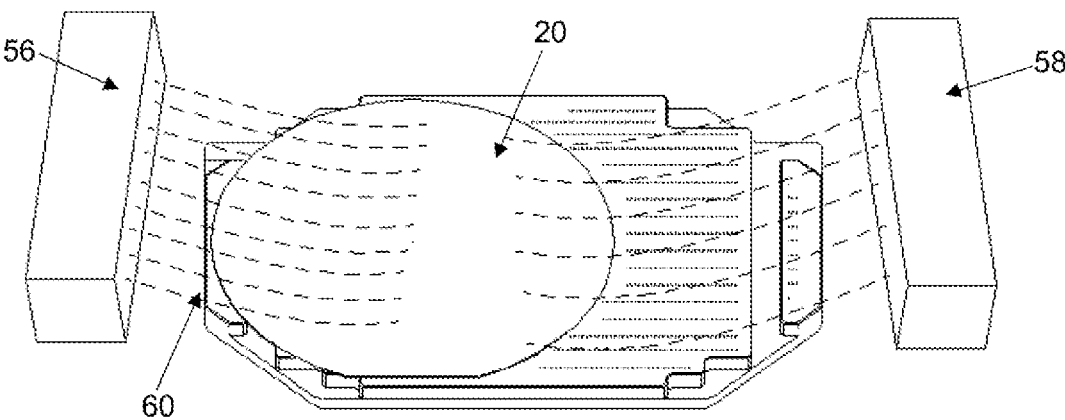
FIG. 10 is a perspective view of the bonding platform illustrating the generation of a heated air stream across a top surface of the substrate positioned on the bonding platform.

FIG. 10 is a perspective view of the bonding platform 10 illustrating the generation of a heated air stream 60 across a top surface of the substrate 20 positioned on the bonding platform 10. The heated air stream 60 is blown towards the substrate 20 positioned on the bonding platform 10 both from a left heater air blower 56 and a right heater air blower 58 that are located at opposite sides of the top plate 28 comprising the first and second bonding positions. The heated air stream 60 is operative to maintain a desired elevated temperature of the substrate 20 which promotes a suitable bonding environment during bonding operations.

Ideally, the left heater air blower 56 and right heater air blower 58 blow heated air onto the substrate 20 to allow a temperature at a top surface of the substrate 20 to be the same as or similar to a temperature at a bottom surface of the substrate 20 that is being heated by the bonding platform 10. This will allow uniform temperature distribution across a height of the substrate 20.

A shortcoming of using a single heating source from the bonding platform 10 to heat the substrate 20 only from below is that the substrate will warp due to different temperatures at top and bottom surfaces of the substrate 20. Therefore, the left and right heater air blowers 56, 58 introducing a fluid heating system over the substrate 20 serves to complement heat produced from the bonding platform 10 in order to provide a uniform thermal environment for the substrate 20, so that the substrate 20 can thermally expand uniformly from the balanced rise in temperature.

Figure 11:
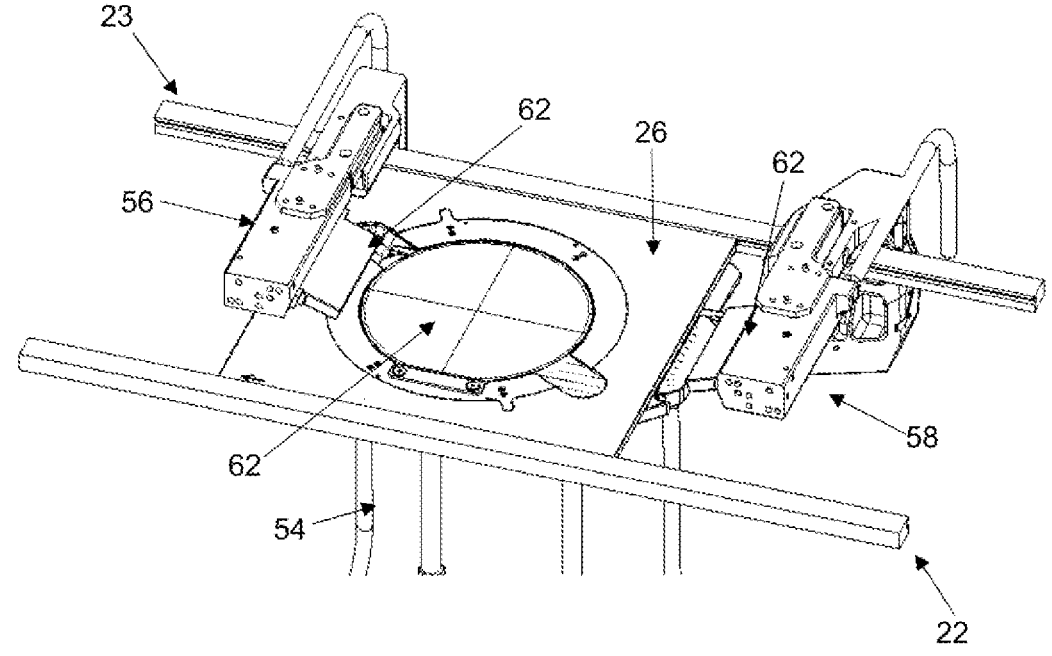
FIG. 11 is a perspective view of heater air blower positioned on either side of the bonding platform for introducing the air stream onto the substrate positioned on the bonding platform.

FIG. 11 is a perspective view of heater air blowers 56, 58 positioned on either side of the bonding platform 10 for introducing the heated air stream 60 onto the substrate 20 positioned on the bonding platform 10. Both the left heater air blower 56 and the right heater air blower 58 include air nozzles 62 extending from the heater air blowers 56, 58, in order to direct heated air steams 60 from different directions over the top surface of the substrate 20.

Heater rods (not shown) are incorporated within a metallic block body in each heater air blower 56, 58 for heating an air stream, so that the air stream 60 that is blown out from the air nozzles 62 is heated.

As previously described, the substrate 20 is supported on a substrate carrier 26 which is movable along the front track 22 and rear track 23. Vacuum pipes 54 connected to a base of the bonding platform 10 provide vacuum suction forces for securing the substrate 20 onto the bonding platform 10.

It should thus be appreciated that, in the preferred embodiment of the invention, a multiple stage vacuum method is adopted, creating multiple vacuum areas to secure the substrate 20 in a sequential manner in order to minimize warpage. To avoid thermal shock or uneven heating, heater air blowers 56, 58 may be added over the top surface of the substrate 20 in addition to a conventional bottom heater bock located below the substrate 20 to allow top and bottom surfaces of the substrate to thermally expand uniformly. By applying thermal energy to both the top and bottom surfaces of the substrate 20, uniform thermal expansion of the substrate 20 is beneficially experienced prior to bonding.

Furthermore, a method has been provided for handling thin and fragile substrates 20 such as a semiconductor wafer secured on a wire bonding machine by controlling the vacuum pressure to increase gradually in two or more stages or phases to secure the substrate 20. Multiple vacuum areas are being controlled to secure the substrate 20 at the effective bonding position.

The invention described herein is susceptible to variations, modifications and/or additions other than those specifically described and it is to be understood that the invention includes all such variations, modifications and/or additions which fall within the spirit and scope of the above description.

The invention claimed is:

1. A bonding apparatus for holding a fragile semiconductor substrate during interconnect bonding operations conducted on the substrate, the bonding apparatus comprising:

a bonding platform having a top plate for supporting the substrate;

a plurality of vacuum holes situated on the top plate operative to generate vacuum suction forces on the substrate during bonding, the plurality of vacuum holes forming a first vacuum section, a second vacuum section, and a third vacuum section located between the first and second vacuum sections;

first, second and third vacuum supplies connected to the first, second and third vacuum sections respectively, the first, second and third vacuum supplies being individually controllable; and a substrate carrier configured to convey the substrate relative to the bonding platform to introduce the substrate to different bonding positions over the bonding platform;

wherein the first and second vacuum supplies cooperate to generate a vacuum suction force at the first and second vacuum sections when the substrate carrier positions the substrate at a first bonding position, and the second and third vacuum supplies cooperate to generate a vacuum suction force at the second and third vacuum sections when the substrate carrier positions the substrate at a second bonding position different from the first bonding position.

2. The bonding apparatus as claimed in claim 1, wherein the first, second and third vacuum section are connected to a vacuum generator having a variable vacuum force comprising two or more phases.

3. The bonding apparatus as claimed in claim 2, wherein the vacuum generator comprises at least a first phase for applying a first vacuum force, and a second phase for applying a second vacuum force that is higher than the first vacuum force.

4. The bonding apparatus as claimed in claim 3, further comprising a pressure control solenoid valve or variable pressure regulator operatively connected to the vacuum generator for increasing or decreasing the vacuum force between the first and second phases.

5. The bonding apparatus as claimed in claim 1, wherein the substrate includes an opening through which the substrate is in fluid communication with the plurality of vacuum holes during bonding.

6. The bonding apparatus as claimed in claim 5, further comprising at least one track along which the substrate carrier is guided to move relative to the bonding platform.

7. The bonding apparatus as claimed in claim 5, further comprising a rotary indexer operative to rotate the substrate relative to the bonding platform while the substrate is being carried by the substrate carrier.

8. The bonding apparatus as claimed in claim 5, wherein the bonding platform is movable towards and away from the substrate carrier, and the bonding platform is moved towards the substrate carrier to apply the vacuum suction force on the substrate during bonding.

9. The bonding apparatus as claimed in claim 8, wherein the bonding platform is moved away from the substrate carrier when the substrate carrier is conveying the substrate relative to the bonding platform.

10. The bonding apparatus as claimed in claim 1, wherein the first bonding position and the second bonding position are each locatable at a bonding area which corresponds to one quadrant of the substrate.

11. The bonding apparatus as claimed in claim 1, wherein the first, second and third vacuum supplies are fluidly connected to the plurality of vacuum holes through air channels formed in the bonding platform.

12. The bonding apparatus as claimed in claim 11, further comprising vacuum pipes connecting the air channels in the bonding platform to the first, second and third vacuum supplies.

13. The bonding apparatus as claimed in claim 1, further comprising a compressed air supply connected to the plurality of vacuum holes via a fast release channel to provide air pressure to the plurality of vacuum holes to assist removal of the substrate from the top plate.

14. The bonding apparatus as claimed in claim 1, further comprising a main solenoid valve centrally controlling the first, second and third vacuum supplies to control the vacuum suction force generated at the respective vacuum sections on the top plate.

15. The bonding apparatus as claimed in claim 1, further comprising at least one heater blower positioned over the bonding platform that is operative to blow a heated air stream across a top surface of the substrate positioned on the top plate.

16. The bonding apparatus as claimed in claim 15, wherein the at least one heater blower comprises a first heater blower and a second heater blower located at opposite sides of the first and second bonding positions to blow heated air streams from different directions.

17. The bonding apparatus as claimed in claim 15, wherein the heated air stream is operative to heat the top surface of the substrate to be substantially the same as a temperature at a bottom surface of the substrate that is being heated by the bonding platform.

18. Method for bonding interconnects on a fragile semiconductor substrate, the method comprising the steps of:

supporting the substrate on a bonding platform having a top plate, the top plate including a plurality of vacuum holes situated thereon operative to generate vacuum suction forces on the substrate during bonding, wherein the plurality of vacuum holes form a first vacuum section connected to a first vacuum supply, a second vacuum section connected to a second vacuum supply, and a third vacuum section connected to a third vacuum supply, the third vacuum section being located between the first and second vacuum sections, and wherein the first, second and third vacuum supplies are individually controllable;

conveying the substrate by a substrate carrier relative to the bonding platform to a first bonding position, and activating the first and second vacuum supplies to generate a vacuum suction force at the first and second vacuum sections when the substrate carrier positions the substrate at the first bonding position; and conveying the substrate by the substrate carrier to a second bonding position, which is different from the first bonding position, and activating the second and third vacuum supplies to generate a vacuum suction force at the second and third vacuum sections when the substrate carrier positions the substrate at the second bonding position.

* * * * *